(12) United States Patent
Eun

(10) Patent No.: US 7,276,725 B2
(45) Date of Patent: Oct. 2, 2007

(54) BIT LINE BARRIER METAL LAYER FOR SEMICONDUCTOR DEVICE AND PROCESS FOR PREPARING THE SAME

(75) Inventor: Byung Soo Eun, Seoul (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 333 days.

(21) Appl. No.: 11/052,403

(22) Filed: Feb. 7, 2005

(65) Prior Publication Data
US 2006/0118954 A1    Jun. 8, 2006

(30) Foreign Application Priority Data
Dec. 2, 2004   (KR) .................. 10-2004-0100513

(51) Int. Cl.
*H01L 29/06* (2006.01)
(52) U.S. Cl. ...................... 257/35; 257/9; 257/297; 257/906; 257/907; 257/E21.657; 257/E21.658
(58) Field of Classification Search ............... 257/9, 257/35, 297, 906, 907, E21.657, E21.658
See application file for complete search history.

(56) References Cited

U.S. PATENT DOCUMENTS

| | | | | |
|---|---|---|---|---|
| 5,839,363 | A * | 11/1998 | Yanagisawa et al. | 101/123 |
| 6,632,739 | B2 | 10/2003 | Watatani | |
| 6,657,265 | B2 | 12/2003 | Fujisawa et al. | |
| 2004/0070649 | A1 * | 4/2004 | Hess et al. | 347/63 |

FOREIGN PATENT DOCUMENTS

KP    1020010011307    2/2001

* cited by examiner

Primary Examiner—Matthew Smith
Assistant Examiner—Thanh Van Pham
(74) Attorney, Agent, or Firm—Marshall Gerstein & Borun LLP

(57) ABSTRACT

The present invention relates to a bit line barrier metal layer for a semiconductor device and a process for preparing the same, the process comprising: forming bit line contact on an insulation layer vapor-deposited on an upper part of a substrate so as to expose an ion implantation region; vapor-depositing a first barrier metal layer of a Ti film on the entire upper surface thereof; and vapor-depositing, on the upper part of the Ti film, a second barrier metal layer of a $ZrB_2$ film having different upper and lower Boron concentrations, by RPECVD controlling the presence/absence of $H_2$ plasma, wherein the barrier metal layer includes the Ti film, lower $ZrB_2$ film and upper a $ZrB_2$ film sequentially stacked between tungsten bit lines and ion implantation region of a semiconductor substrate. Therefore, the present invention can decrease contact resistance between tungsten bit lines and an ion implantation region by utilizing a $ZrB_2$ film having near-amorphous film quality as a barrier metal of tungsten bit lines and thereby preventing diffusion of the dopant doped onto the ion implantation region of a substrate to the outside in a subsequent thermal treatment process, and at the same time, can reduce occurrence of parasitic capacitance between adjacent bit lines by decreasing a thickness of barrier metal layer, thus leading to improved characteristics of the semiconductor device.

5 Claims, 3 Drawing Sheets

BIT LINE BARRIER METAL LAYER FOR SEMICONDUCTOR DEVICE AND PROCESS FOR PREPARING THE SAME

BACKGROUND OF THE INVENTION

1. Field of the Invention

The present invention relates to a bit line barrier metal layer for a semiconductor device and a process for preparing the same. More specifically, the present invention relates to a bit line barrier metal layer for a semiconductor device, having improved performance and characteristics due to reduction of contact resistance of bit lines and reduction of parasitic capacitance generation between adjacent bit lines, and a process for preparing the same.

2. Description of the Related Art

Recently, with the extremely increased degree of integration of semiconductor devices, materials for bit lines are changing from polysilicon and tungsten silicide structures to chemically vapor deposited tungsten (CVD-W).

As such, in order to form tungsten bit lines, a barrier metal layer should be first vapor-deposited to decrease contact resistance between the tungsten bit lines and a substrate prior to vapor-deposition of tungsten.

For the barrier metal, Ionized Metal Plasma (IMP) Ti—TiN is generally used.

The conventional process for forming bit lines will here be described in more detail.

The process for forming bit lines using the conventional arts involves, firstly forming bit line contact of exposing a part of a substrate on an insulation layer vapor-deposited on the substrate, and then implanting additional ions corresponding to a type of cell transistor onto the exposed substrate. Implantation of additional ions onto the exposed substrate serves to prevent the concentration of ions which were implanted onto the substrate from being decreased in the exposed substrate region, by diffusion of ions through other thermal treatment processes prior to formation of bit lines. When ion concentration of the exposed substrate region, that is, ion concentration of the substrate facing bit lines is lowered, this may result in increased contact resistance therebetween.

Next, IMP Ti is vapor-deposited to a predetermined thickness on the inner wall of the bit line contact under the condition in which bias is not applied, and then the IMP TiN is vapor-deposited thereon by applying a bias of 200 W.

Next, rapid thermal treatment is performed to prepare titanium silicide (TiSix) and then the IMP TiN is vapor-deposited again.

The reason why vapor-deposition of TiN is separately performed in two steps is to correct cracking occurring after rapid thermal treatment, because TiN vapor deposited on the upper part may react with TiSix and Ti of the lower part to produce high-resistance TiF, by way of WF6 gas used for vapor-deposition of tungsten bit lines which will be subsequently formed through columnar grain boundaries.

FIG. 1 is an electron micrograph showing the columnar grain boundary of TiN.

The total thickness of the barrier metal layer is about 500 Å. Where the barrier metal is vapor-deposited to an excessive thickness, an etch amount of the tungsten bit lines is then increased and the height of the tungsten bit lines is likewise increased, thus leading to the occurrence of parasitic capacitance between adjacent tungsten bit lines.

Therefore, the parasitic capacitance, having thus occurred, may cause problems such as decreased capacitance of cell capacitors in semiconductor devices and thus reduction in refresh time.

FIG. 2 schematically shows a position of parasitic capacitance occurring between conventional tungsten bit lines.

As discussed above, in a tungsten bit line manufacturing process of the conventional semiconductor devices utilizing the IMP TiN as the barrier metal, prevention of TiF production caused by penetration of $WF_6$ gas through grain boundaries due to a micro columnar grain structure of the IMP TiN is an important parameter to reduce contact resistance.

However, the above-mentioned IMP TiN columnar grain boundaries suffer from another problem in that a dopant may be diffused to the outside through the columnar grain boundaries.

Conventional DRAM (Dynamic Random Access Memory) employs a PMOS as a cell transistor and the PMOS uses boron (B) ions, which rapidly diffuse into Source and Drain regions, as the dopant.

Since the boron ion dopant exhibits rapid diffusion and thus diffuses through the IMP TiN columnar grain boundaries during a high temperature thermal treatment process, this causes the problem of increasing contact resistance with the bit lines.

In particular, due to the high degree integration of semiconductor devices, when TiN is applied to the semiconductor device of sub-nanometer size, it may cause degradation of the semiconductor device characteristics thus resulting in reduced yield thereof.

SUMMARY OF THE INVENTION

Therefore, the present invention has been made in view of the above problems, and it is an object of the present invention to provide a bit line barrier metal layer for a semiconductor device, having reduced contact resistance between a substrate and tungsten bit lines by prevention of diffusion of ions implanted onto the substrate, and a process for preparing the same.

It is another object of the present invention to provide a bit line barrier metal layer for a semiconductor device, capable of preventing resistance increase of the barrier metal in forming tungsten bit lines, and a process for preparing the same.

It is a further object of the present invention to provide a bit line barrier metal layer for a semiconductor device, capable of securing a process margin by reducing the thickness of the barrier metal layer and reducing occurrence of parasitic capacitance by decreasing the height of tungsten bit lines, and a process for preparing the same.

In accordance with an aspect of the present invention, the above and other objects can be accomplished by the provision of a bit line barrier metal layer for a semiconductor device, having reduced contact resistance between tungsten bit lines and an ion implantation region of a substrate, wherein the barrier metal layer has a stacked structure of a Ti film and a $ZrB_2$ film.

The $ZrB_2$ film is preferably configured to have a bilayer structure made up of a lower $ZrB_2$ film facing the Ti film and an upper $ZrB_2$ film facing the tungsten bit lines. Preferably, the lower $ZrB_2$ film has a quantitative Boron ratio of greater than 3.6, relative to Zirconium, and the upper $ZrB_2$ film has a quantitative Boron ratio of less than 2.0, relative to Zirconium.

In addition, the lower $ZrB_2$ film is vapor-deposited by Remote Plasma Enhanced Chemical Vapor Deposition (RPECVD) without use of $H_2$, and the upper $ZrB_2$ film is vapor-deposited by RPECVD with use of H2. Preferably, each film has a thickness of 100 Å.

In accordance with another aspect of the present invention, there is provided a process for preparing a bit line barrier metal layer for a semiconductor device comprising, forming bit line contact on an insulation layer vapor-deposited on an upper part of a substrate so as to expose an ion implantation region;

vapor-depositing a first barrier metal layer of a Ti film on the entire upper surface thereof; and vapor-depositing, on the upper part of the Ti film, a second barrier metal layer of a $ZrB_2$ film having different upper and lower Boron concentrations, by RPECVD controlling the presence/absence of $H_2$ plasma.

In forming the $ZrB_2$ film, preferably, the lower $ZrB_2$ film is vapor-deposited by RPECVD utilizing no $H_2$, while the upper $ZrB_2$ film is vapor-deposited on the upper part of the lower $ZrB_2$ film by RPECVD utilizing $H_2$. RPECVD for vapor-depositing the $ZrB_2$ film uses $Zr(BH_4)_4$ as a source gas. Preferably, the RPECVD is performed at a temperature of 180 to 300° C., under a pressure of 10-5 to 10-3 torr.

Preferably, the process may further comprise thermal treatment using $N_2$ gas at a temperature of 700° C. for 20 min, such that Boron ions in the $ZrB_2$ film diffuse into the ion implantation region.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
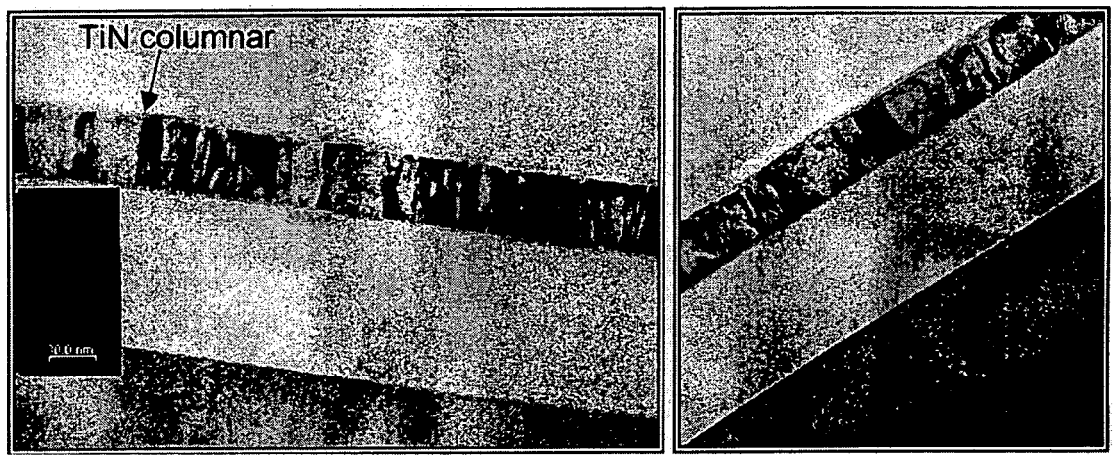
FIG. 1 is an EM of the columnar grain boundary of TiN that is a conventional bit line barrier metal layer.
Figure 2:
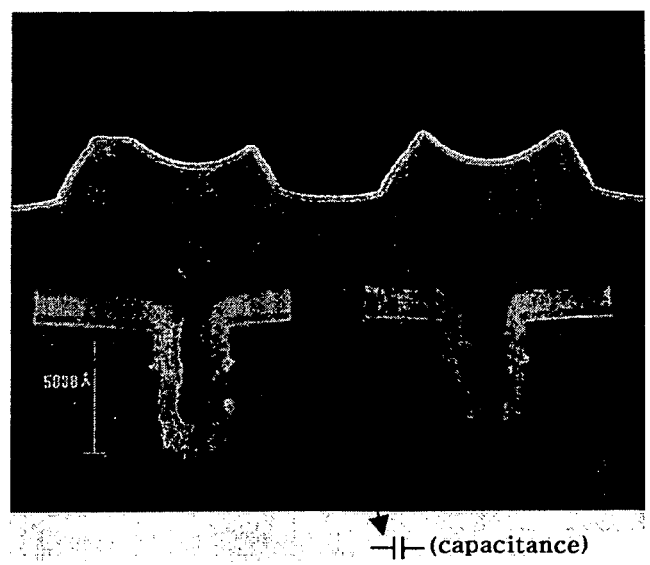
FIG. 2 is a schematic cross-sectional view showing occurrence of parasitic capacitance between conventional bit lines.

Now, the present invention will be described in more detail with reference to accompanying drawings, such that those skilled in the art can easily practice the present invention.

In the drawings, thicknesses of various layers and regions are exaggerated for clarity. Like numbers refer to like elements throughout the specification and drawings.

FIGS. 3a through 3d show sequential cross-sectional views of a process for preparing a bit line barrier metal layer for a semiconductor device in accordance with the present invention.

Figure 3A:
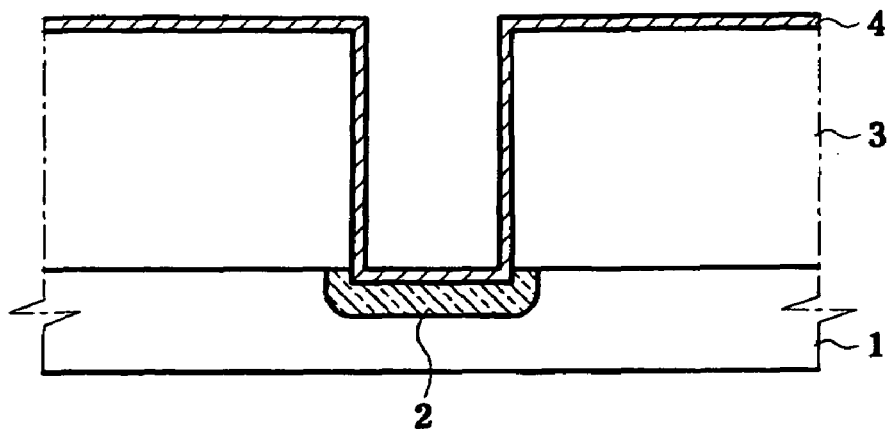
FIGS. 3a through 3d show sequential cross-sectional views of a process for preparing a bit line barrier metal layer for a semiconductor device in accordance with the present invention.
Figure 3B:
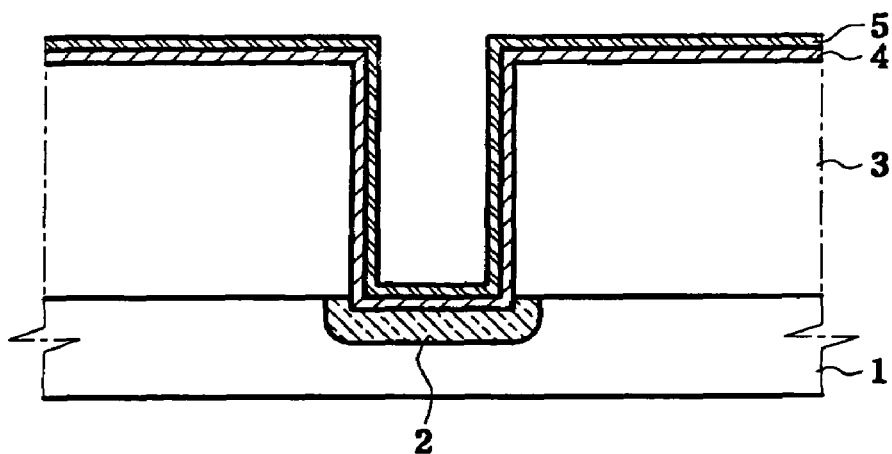
Figure 3C:
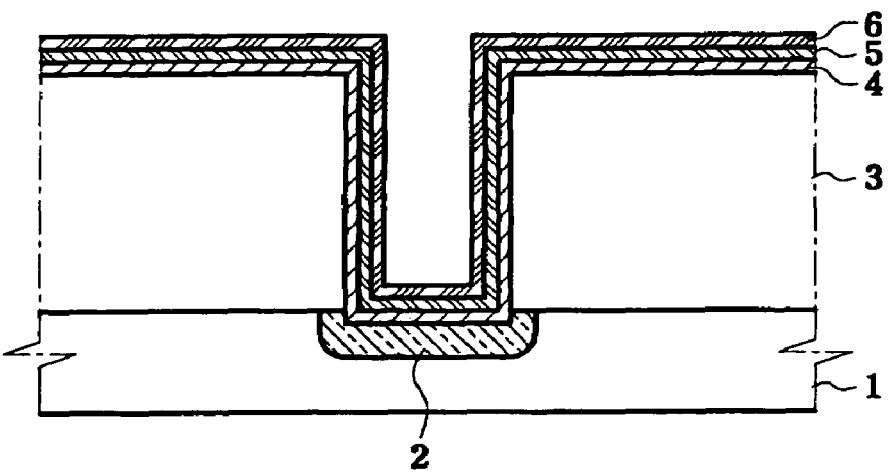
Figure 3D:
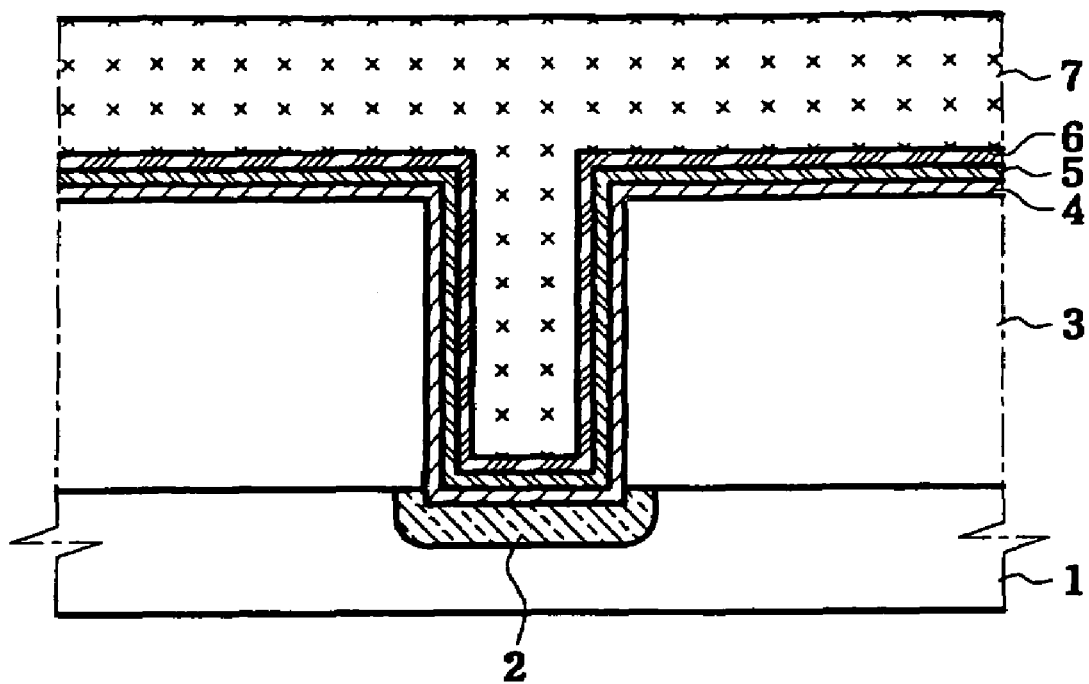

As shown in FIGS. 3a through 3d, the process is performed as follows. Firstly, an insulation film 3 is vapor-deposited on an upper part of a substrate 1 including an ion implantation region 2 and a contact hole is formed on the insulation film 3 so as so expose the upper part of the ion implantation region 2. This is followed by vapor-depositing a Ti film 4 (FIG. 3a), vapor-depositing a lower $ZrB_2$ film 5 on the entire upper surface of the above-mentioned structure (FIG. 3b), vapor-depositing an upper $ZrB_2$ film 6 on the entire upper surface of the above-mentioned structure using hydrogen RPE (Remote Plasma Enhanced) (FIG. 3c), and vapor-depositing tungsten on the entire upper surface of the above-mentioned structure to form tungsten bit lines 7 (FIG. 3d).

Hereinafter, the above-mentioned constitution of the present invention will be described in more detail.

Firstly, as shown in FIG. 3a, the insulation film 3 is vapor-deposited on the upper part of the substrate 1 including the ion implantation region 2.

The above-mentioned structure is simplified for convenient illustration. In order to fabricate semiconductor devices such as DRAM, a cell transistor is formed on the substrate 1. The ion implantation region 2 refers to a junction region such as a source or drain region of the cell transistor.

Next, bit line contact is formed on the insulation film 3 so as to expose the upper part of the ion implantation region 2.

Next, IMP Ti is vapor-deposited on the entire upper surface of the above-mentioned structure so as to form the Ti film 4, without application of bias. In this connection, the Ti film 4 is vapor-deposited to a thickness of about 100 Å.

Then, as shown in FIG. 3b, the lower $ZrB_2$ film 5 is formed utilizing Remote Plasma Enhanced Chemical Vapor Deposition (RPECVD). The RPECVD employs $Zr(BH_4)_4$ as the source gas and is performed at a vapor-deposition temperature of 180 to 300° C. under vapor-deposition pressure of 10-5 to 10-3 torr, such that the lower $ZrB_2$ film 5 has a thickness of about 100 Å.

The source gas of the lower $ZrB_2$ film 5 in accordance with the embodiment of the present invention, $Zr(BH_4)_4$ is thermally degradable at a low temperature, and the resulting by-products do not contain oxygen and carbon components, thus being capable of preventing post-process contamination.

Contamination due to the above-mentioned by-products may cause increased resistance of the vapor-deposited thin film, but $Zr(BH_4)_4$ contains no components responsible for resistance increase due to contamination resulting from by-products and thus is capable of maintaining a very low resistance of about 40 to 60 μΩ/cm.

In addition, the $Zr(BH_4)_4$ contains a large number of Boron ions and thus is capable of maintaining relevant contact resistance without additional ion implantation as in conventional arts.

Also, the lower $ZrB_2$ film 5 has near-amorphous film quality and thus is capable of preventing diffusion of the dopant implanted to the ion implantation region 2 to the outside.

As described above, the lower $ZrB_2$ film 5 is a barrier metal capable of resolving all the problems exhibited by the conventional TiN.

Next, as shown in FIG. 3c, the upper $ZrB_2$ film 6 is additionally formed to a thickness of 100 Å using RPECVD. The RPECVD conditions for forming the upper $ZrB_2$ film 6 are the same as those for forming the lower $ZrB_2$ film 5.

Provided that the upper $ZrB_2$ film 6 employs $H_2$ as the RPE (Remote Plasma Enhanced), but the lower $ZrB_2$ film 5 does not employs $H_2$.

Utilization of $H_2$ as the RPE results in decreased concentration of Boron ions in the thin film, compared to when $H_2$ is not used.

That is, the upper $ZrB_2$ film 6 has a relatively lower Boron ion concentration than the lower $ZrB_2$ film 5.

Even though the upper $ZrB_2$ film 6 has a relatively low Boron ion concentration, it may prevent reaction of Boron ions with oxygen molecules upon exposure to the atmosphere.

If Boron ions combine with oxygen molecules, the resistance of the $ZrB_2$ film 6 rapidly increases. Therefore, in order to prevent this phenomenon, the upper $ZrB_2$ film 6 is formed to have a low Boron ion concentration.

The upper $ZrB_2$ film 6 is made to have a quantitative Boron ratio of less than 2.0, relative to Zirconium, and the lower $ZrB_2$ film 5 is made to have a quantitative Boron ratio of greater than 3.6, relative to Zirconium.

In addition, the upper $ZrB_2$ film 6 also has near-amorphous film quality and thus is capable of preventing diffusion of the dopant doped onto the ion implantation region 2 to the outside.

Further, unlike the conventional TiN, the upper $ZrB_2$ film 6 and lower $ZrB_2$ film 5 have no grain boundaries and thus do not undergo any increase of resistance in the subsequent tungsten vapor-deposition process.

The lower $ZrB_2$ film 5 and upper $ZrB_2$ film 6 can provide desired characteristics even when vapor-deposited to a thickness of 100 Å. In addition, it is possible to significantly reduce the thickness of those films compared to the conventional TiN and thus to reduce occurrence of parasitic capacitance between bit lines.

Next, as shown in FIG. 3d, thermal treatment is performed so as to increase the compactness of the thus-formed barrier metal layer, i.e., the lower $ZrB_2$ film 5 and upper $ZrB_2$ film 6 and to diffuse Boron ions in the lower $ZrB_2$ film 5 into the ion implantation region 2. In this connection, thermal treatment is performed at a temperature of 700° C. for 20 min, using $N_2$ gas.

Next, tungsten is vapor-deposited to a thickness of 700 Å to form tungsten bit lines 7 utilizing chemical vapor-deposition.

As apparent from the above description, the present invention can prevent any increase in the contact resistance between the bit lines and substrate by utilizing a $ZrB_2$ film having near-amorphous film quality as a barrier metal of tungsten bit lines and thereby preventing diffusion of the dopant doped onto the ion implantation region of a substrate to the outside in a subsequent thermal treatment process.

In addition, the present invention provides a barrier metal layer in which a $ZrB_2$ film is made up of a lower $ZrB_2$ film having a high Boron ion concentration and an upper $ZrB_2$ film having a lower Boron ion concentration than the lower $ZrB_2$ film, and thus can reduce contact resistance between the ion implantation region and lower $ZrB_2$ film through diffusion without separate ion implantation. The present invention also provides the effect of preventing any resistance increase by preventing reaction of outside oxygen with the Boron contained in the upper $ZrB_2$ film.

The $ZrB_2$ film used as the barrier metal in the present invention can achieve desired characteristics even though it is thinner than a conventional barrier metal, TiN, and thereby it is possible to reduce parasitic capacitance between bit lines by lowering the height of the bit lines. Accordingly, the refresh time of the semiconductor device can be increased.

In addition, since the $ZrB_2$ film barrier metal of the present invention has no columnar grain boundaries exhibited by the conventional TiN, it is possible to prevent increase in the resistance due to penetration of the Fluorine contained in a vapor-deposition source during a tungsten vapor-deposition process.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A bit line barrier metal layer for a semiconductor device, having reduced contact resistance between tungsten bit lines and an ion implantation region of a substrate, wherein the barrier metal layer has a stacked structure of a Ti film and a ZrB2 film.

2. The bit line barrier metal layer as set forth in claim 1, wherein the ZrB2 film has a bilayer structure made up of a lower ZrB2 film facing the Ti film and an upper ZrB2 film facing the tungsten bit lines.

3. The bit line barrier metal layer as set forth in claim 2, wherein the lower ZrB2 film has a quantitative Boron ratio of greater than 3.6, relative to Zirconium, and the upper ZrB2 film has a quantitative Boron ratio of less than 2.0, relative to Zirconium.

4. The bit line barrier metal layer as set forth in claim 2, wherein the lower ZrB2 film is vapor-deposited by Remote Plasma Enhanced Chemical Vapor Deposition (RPECVD) without use of H2, and the upper ZrB2 film is vapor-deposited by RPECVD with use of H2.

5. The bit line barrier metal layer as set forth in claim 2, wherein the lower and upper ZrB2 films are vapor-deposited to a thickness of 100 Å, respectively.

* * * * *

UNITED STATES PATENT AND TRADEMARK OFFICE
CERTIFICATE OF CORRECTION

PATENT NO. : 7,276,725 B2
APPLICATION NO. : 11/052403
DATED : October 2, 2007
INVENTOR(S) : Byung S. Eun It is certified that error appears in the above-identified patent and that said Letters Patent is hereby corrected as shown below:

On the First Page:

At field (74), "Marshall" should be -- Marshall, --.

In the Claims:

At Column 6, line 28, "ZrB2" should be -- $ZrB_2$ --.

At Column 6, line 30, "ZrB2" should be -- $ZrB_2$ --.

At Column 6, line 31, "ZrB2" should be -- $ZrB_2$ --.

At Column 6, line 31, "ZrB2" should be -- $ZrB_2$ --.

At Column 6, line 34, "ZrB2" should be -- $ZrB_2$ --.

At Column 6, line 36, "ZrB2" should be -- $ZrB_2$ --.

At Column 6, line 39, "ZrB2" should be -- $ZrB_2$ --.

At Column 6, line 41, "H2" should be -- $H_2$ --.

At Column 6, line 41, "ZrB2" should be -- $ZrB_2$ --.

At Column 6, line 42, "H2" should be -- $H_2$ --.

UNITED STATES PATENT AND TRADEMARK OFFICE
CERTIFICATE OF CORRECTION

PATENT NO. : 7,276,725 B2
APPLICATION NO. : 11/052403
DATED : October 2, 2007
INVENTOR(S) : Byung S. Eun It is certified that error appears in the above-identified patent and that said Letters Patent is hereby corrected as shown below:

At Column 6, line 44, "ZrB2" should be -- $ZrB_2$ --.

Signed and Sealed this

Third Day of June, 2008

JON W. DUDAS
*Director of the United States Patent and Trademark Office*